United States Patent
Kohno et al.

(10) Patent No.: US 7,276,742 B2
(45) Date of Patent: Oct. 2, 2007

(54) COMPOUND SEMICONDUCTOR LIGHT EMITTING DEVICE AND ITS MANUFACTURING METHOD

(75) Inventors: Keishi Kohno, Tottori (JP); Katsumi Yagi, Suita (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 110 days.

(21) Appl. No.: 10/495,964

(22) PCT Filed: Nov. 19, 2002

(86) PCT No.: PCT/JP02/12087

§ 371 (c)(1),
(2), (4) Date: May 19, 2004

(87) PCT Pub. No.: WO03/044872

PCT Pub. Date: May 30, 2003

(65) Prior Publication Data

US 2005/0012109 A1     Jan. 20, 2005

(30) Foreign Application Priority Data

| Nov. 19, 2001 | (JP) | ............... | 2001-353003 |
| Nov. 22, 2001 | (JP) | ............... | 2001-358042 |
| May 14, 2002 | (JP) | ............... | 2002-138356 |
| May 14, 2002 | (JP) | ............... | 2002-138357 |
| Oct. 2, 2002 | (JP) | ............... | 2002-289731 |
| Oct. 2, 2002 | (JP) | ............... | 2002-289732 |

(51) Int. Cl.
*H01L 21/00* (2006.01)
*H01L 33/00* (2006.01)

(52) U.S. Cl. ............... 257/103; 257/99; 257/94; 257/96; 257/97; 257/98; 438/22; 438/26; 438/46; 438/212; 438/213

(58) Field of Classification Search ............... 257/99, 257/101, 96, 97, 98, 103, 80, 100
See application file for complete search history.

(56) References Cited

U.S. PATENT DOCUMENTS 6,239,033 B1     5/2001   Kawai

FOREIGN PATENT DOCUMENTS

EP     0 573 270     12/1993

(Continued)

*Primary Examiner*—Sue A. Purvis
*Assistant Examiner*—Fazli Erdem
(74) *Attorney, Agent, or Firm*—Westerman, Hattori, Daniels & Adrian, LLP.

(57) ABSTRACT

A compound semiconductor light emitting device for preparing a chip which improves the light extraction efficiency, enables mounting of easy positioning with only once wire bonding, and leads to a reduction in the manhour. One face of an insulative substrate (11) is overlaid with a semiconductor layer (4) consisting of a plurality of semiconductor thin films to form an active layer (15). One electrode (33) is formed on the top face of this semiconductor layer (4), and the other electrode (33) on the other face of the insulative substrate (11). For the exposure of a first semiconductor thin film layer (13) connected to the other electrode (33), the semiconductor film over the first semiconductor thin film layer (13) is removed to form an exposure region (10). This exposure region (10) is provided with a through hole (2) penetrating through the insulative substrate (11) and first semiconductor thin film layer (13).

The first semiconductor thin film layer (13) and the other electrode (33) are electrically connected with a conductive material (3) formed on the through hole (2).

31 Claims, 13 Drawing Sheets

| | FOREIGN PATENT DOCUMENTS | |
|---|---|---|
| JP | 61-91930 | 5/1986 |
| JP | 61-245993 | 11/1986 |
| JP | 8-83929 | 3/1996 |
| JP | 8-255926 | 10/1996 |
| JP | 10-117058 | 5/1998 |
| JP | 10-173235 | 6/1998 |
| JP | 10-173236 | 6/1998 |
| JP | 10-308560 | 11/1998 |
| JP | 11-145514 | 5/1999 |
| JP | 2001-111106 | 4/2001 |
| JP | 2003-17790 | 1/2003 |
| JP | 2003-218388 * | 1/2006 |

* cited by examiner

COMPOUND SEMICONDUCTOR LIGHT EMITTING DEVICE AND ITS MANUFACTURING METHOD

BACKGROUND OF THE INVENTION

1. Field of the Invention

The present invention relates to a compound semiconductor light emitting device such as a blue light emitting diode and a blue laser diode as well as its manufacturing method. This invention particularly relates to a light emitting device comprising a nitride-based compound semiconductor epitaxially grown on an insulative substrate such as a sapphire substrate, and its manufacturing method.

2. Description of Prior Art

Epitaxial growth of nitride-based compound semiconductors used for blue light emitting diodes, blue laser diodes and the like is generally performed on a sapphire ($Al_2O_3$) substrate whose lattice constant is similar to that of the nitride-based compound semiconductors. FIG. 23 illustrates an example of a basic structure of a blue light emitting semiconductor device comprised of a nitride-based compound semiconductor. A buffer layer 220 made of $Al_xGa_{1-x}N$ ($0 \leq X \leq 1$) for example is formed on a sapphire substrate 210, and an n-type contact layer 230 made of n-type GaN doped with silicon (Si) for example is formed on the buffer layer 220. An n-type cladding layer 240 made of n-type $Al_xGa_{1-x}N$ ($0 \leq X \leq 1$) doped with silicon (Si) for example is formed on the n-type contact layer 230. A multi-quantum well structure active layer 250 having a composition of $Al_aIn_bGa_{1-a-b}N$ ($0 \leq a$, $0 \leq b$, $a+b \leq 1$) for example is formed on the n-type cladding layer 240. On this active layer 250, a p-type cladding layer 260 made of p-type $Al_yGa_{1-y}N$ ($0 \leq Y \leq 1$) doped with magnesium (Mg) for example is formed, and a p-type contact layer 270 made of p-type GaN doped with magnesium (Mg) is formed on the p-type cladding layer 260.

A p-type electrode 280 is provided on a surface of the p-type contact layer 270. A part of the laminated semiconductor layer is etched to expose the n-type contact layer 230, on which an n-type electrode 290 is provided.

Electric current does not pass between the electrodes when the electrodes are respectively provided on a rear surface of the substrate and a front surface of the semiconductor layer to bring a pair of electrodes like a conventional light emitting device comprising a conductive substrate because the sapphire substrate behaves as an insulator.

Therefore, as described above, a part of the semiconductor layer is removed from its front surface so that a semiconductor layer of one conductivity type is exposed and an electrode of the other conductivity type is formed on the remaining front surface. Thus, the nitride-based compound semiconductor light emitting device delivers performance by conducting electricity through a pair of electrodes, both of which are provided on the front surface side of the semiconductor layer.

With this structure, the light extraction efficiency is low since the pair of electrodes existing on one side of the semiconductor device shade a lot of light. Also the pair of electrodes existing on one side of the semiconductor device require wire-bonding at least twice. When a chip is mounted face down on a board, the electrodes on the chip must be accurately aligned with corresponding electrodes on the base, involving difficulty in precise alignment.

By the way a semiconductor light emitting device comprising a sapphire substrate with a contact hole to make contact with a semiconductor layer from the sapphire substrate side is disclosed in JP173235/1998, A. This semiconductor light emitting device comprises a sapphire substrate, wherein a rear side thereof is terraced, and a contact hole is provided to a thin-walled part of the terraced rear side of the substrate by reactive ion etching so as to make a semiconductor layer exposed.

It is surely possible to contact the semiconductor layer from the sapphire substrate side, and the electrodes are separately disposed on the substrate side and the semiconductor layer side in the semiconductor light emitting device disclosed in the above-mentioned specification.

However, the manufacturing process of this device becomes complicated because the substrate must be terraced in advance to form the contact hole by reactive ion etching, which may cause frequent cracks in the substrate.

One of the objectives of the present invention is to improve the light extraction efficiency. Another objective is to provide a chip which enables mounting of easy positioning with only once wire bonding, and leads to a reduction in the manhour. A further objective of the present invention is to provide a device with reduced numbers of manufacturing processes and increased process yield by reducing occurrence of cracks in substrates.

SUMMARY OF THE INVENTION

The present invention is characterized by a compound semiconductor light emitting device comprising an insulative substrate which is a sapphire substrate, a first conductivity type semiconductor thin film layer formed on one surface of the insulative substrate, an active layer formed on the first conductivity type semiconductor thin film layer, a second conductivity type semiconductor thin film layer formed on the active layer, one electrode provided on the second conductivity type semiconductor thin film layer, the other electrode provided on the other surface of the insulative substrate, an exposure region formed by removing semiconductor films on the first conductivity type semiconductor thin film layer so that the first conductivity type semiconductor thin film layer to be connected to the other electrode is exposed, a through hole penetrating the insulative substrate and the first conductivity type semiconductor thin film layer so as to reach the exposure region, an electrical path formed in the through hole to electrically connect the first conductivity type semiconductor thin film layer and the other electrode, and a base which comprises a first lead electrode, a second lead electrode, wherein the one electrode is connected to the first lead electrode on the base, the other electrode is connected to the second lead electrode through a bonding wire, and light is extracted mainly from the insulative substrate side, as recited in claim 1.

Also, the present invention is characterized by that the electrical path is comprised of either a conductive material formed on a wall inside the through hole or a conductive material filled in the through hole, as recited in claim 2.

The present invention is characterized by that an ohmic electrode is formed on the first conductivity type semiconductor thin film layer located in the exposure region so as to electrically connect to the electrical path formed in the through hole as well as make ohmic contact with the first conductivity type semiconductor thin film layer, as recited in claim 31.

The present invention is further characterized by that an insulative material is provided to cover the exposure region including the ohmic electrode, as recited in claim 32.

The present invention is further characterized by that the semiconductor thin film layer is a gallium nitride compound semiconductor layer, as recited in claim 4.

The present invention is also characterized by that a diameter of the through hole ranges from 30 µm to 100 µm, as recited in claim 6.

The present invention is characterized by that a groove or a longitudinal hole in addition to the through hole is formed in the insulative substrate so that the electrode provided on the other surface of the insulative substrate and the first semiconductor thin film layer are electrically connected through an electrical path in addition to the electrical path, as recited in claim 7.

The present invention is characterized by a manufacturing method of a compound semiconductor light emitting device comprising laminating a first conductivity type semiconductor thin film layer, an active layer, and a second conductivity type semiconductor thin film layer on one surface of an insulative substrate, and providing one electrode and the other electrode respectively on top surface of the second conductivity type semiconductor thin film layer and on the other surface of the insulative substrate, and the method further comprising forming an exposure region by removing semiconductor films on the first conductivity type semiconductor thin film layer so that the first conductivity type semiconductor thin film layer to be contacted with the other electrode is exposed, forming a through hole by irradiating a short-wavelength laser of 500 nm or shorter so as to penetrate the insulative substrate and the first conductivity type semiconductor thin film layer, and reach the exposure region, electrically connecting the electrode provided on the other surface of the insulative substrate and the first conductivity type semiconductor thin film layer through an electrical path formed in the through hole, connecting the one electrode and a first lead electrode on a base, and connecting the other electrode and a second lead electrode through a bonding wire, as recited in claim 8.

Also, the present invention is characterized by that the through hole penetrating the device is formed in the exposure region by irradiating a laser from the laminated semiconductor layer side, as recited in claim 9.

Additionally, the present invention is characterized by that an inside of the through hole is cleaned by dry etching after the through hole is formed, as recited in claim 10.

The present invention is further characterized by that an inside of the through hole is cleaned by dry etching using chloride or fluoride gas after the through hole is formed, as recited in claim 11.

,The present invention is characterized by that a wafer including a plurality of the light emitting devices is divided into individual light emitting devices along grooves formed by laser-processing, as recited in claim 12.

The present invention is characterized by that semiconductor layers damaged by laser-processing are removed by dry etching using chloride or fluoride gas after the grooves are formed, as recited in claim 13.

The present invention is further characterized by that laser-processing for forming the grooves is performed from the insulative substrate side, or from the laminated semiconductor layer side, or from both the insulative substrate side and the laminated semiconductor layer side, as recited in claim 14.

The present invention is characterized by a compound semiconductor light emitting device comprising an insulative substrate which is a sapphire substrate, a first conductivity type semiconductor thin film layer formed on one surface of the insulative substrate, an active layer formed on the first conductivity type semiconductor thin film layer, a second conductivity type semiconductor thin film layer formed on the active layer, one electrode provided on the second conductivity type semiconductor thin film layer, the other electrode provided on the other surface of the insulative substrate, a longitudinal hole formed by laser-processing so as to penetrate the insulative substrate and have a depth reaching the first conductivity type semiconductor thin film layer to be connected to the other electrode, an electrical path made of a conductive material formed in the longitudinal hole to electrically connect the first semiconductor thin film layer and the other electrode, a base which comprises a first lead electrode, a second lead electrode, wherein the one electrode is connected to the first lead electrode on the base, the other electrode is connected to the second lead electrode through a bonding wire, and light is extracted mainly from the insulative substrate side, as recited in claim 15.

Also, the present invention is characterized by that the conductive material is wholly or partially translucent, as recited in claim 16.

Additionally, the present invention is characterized by that the longitudinal hole is covered with a pad electrode with a larger diameter than a diameter of the longitudinal hole, as recited in claim 17.

The present invention is characterized by that the longitudinal hole is formed inside a lateral surface of the substrate at a constant distance from the lateral surface, as recited in claim 18.

The present invention is further characterized by that a pad electrode is disposed apart from the longitudinal hole on the other surface of the insulative substrate, and the pad electrode and the conductive material are electrically connected, as recited in claim 19.

The present invention is additionally characterized by that a diameter of the longitudinal hole ranges from 30 µm to 100 µm, as recited in claim 20.

The present invention is characterized by that a cross sectional shape of the longitudinal hole is tapered toward a depth direction, as recited in claim 21.

The present invention is further characterized by that the semiconductor thin film layer is a gallium nitride compound semiconductor layer, as recited in claim 22.

Additionally, the present invention is characterized by that a plurality of the longitudinal holes are formed, and conductive materials disposed in the plurality of the longitudinal holes are interconnected on the other surface of the insulative substrate, as recited in claim 24.

The present invention is characterized by that the longitudinal hole is formed by irradiating a laser from the insulative substrate side, as recited in claim 25.

Also, the present invention is characterized by that an inside of the longitudinal hole is cleaned by dry etching using chloride or fluoride gas after the longitudinal hole is formed, as recited in claim 26.

The present invention is characterized by a manufacturing method of a compound semiconductor light emitting device comprising laminating a first conductivity type semiconductor thin film layer an active layer, and a second conductivity type semiconductor thin film layer on one surface of an insulative substrate, and providing one electrode and the other electrode respectively on top surface of the second conductivity type semiconductor thin film layer and on the other surface of the insulative substrate, and the method further comprising forming a longitudinal hole by irradiating a short-wavelength laser of 500 nm or shorter so as to have a depth reaching from the other surface of the insulative substrate to the first conductivity type semiconductor thin film layer to be connected to the other electrode, electrically connecting the electrode provided on the other surface of the insulative substrate and the first semiconductor thin film layer through a conductive material formed in the longitudinal hole, connecting the one electrode and a first lead electrode on a base, and connecting the other electrode and a second lead electrode through a bonding wire, as recited in claim 27.

Also, the present invention is characterized by that a wafer including a plurality of the light emitting devices is divided into individual light emitting devices along grooves formed by laser-processing, as recited in claim 28.

The present invention is further characterized by that semiconductor layers damaged by laser-processing are removed by dry etching using chloride or fluoride gas after the grooves are formed, as recited in claim 29.

And the present invention is characterized by that laser-processing for forming the grooves are performed from the insulative substrate side, or from the laminated semiconductor layer side, or from both the insulative substrate side and the laminated semiconductor layer side, as recited in claim 30.

DESCRIPTION OF PREFERRED EMBODIMENTS

The present invention will be described in more details in conjunction with the accompanying drawings.

Figure 1:
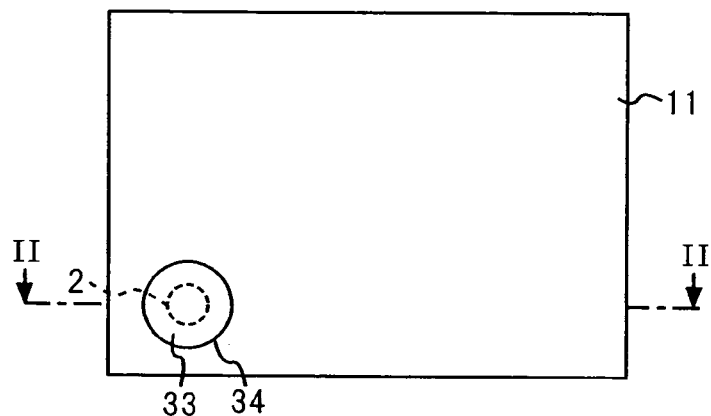
FIG. 1 is a bottom plan view from a rear side of a compound semiconductor light emitting device 1 according to a first embodiment of the present invention.
Figure 2:
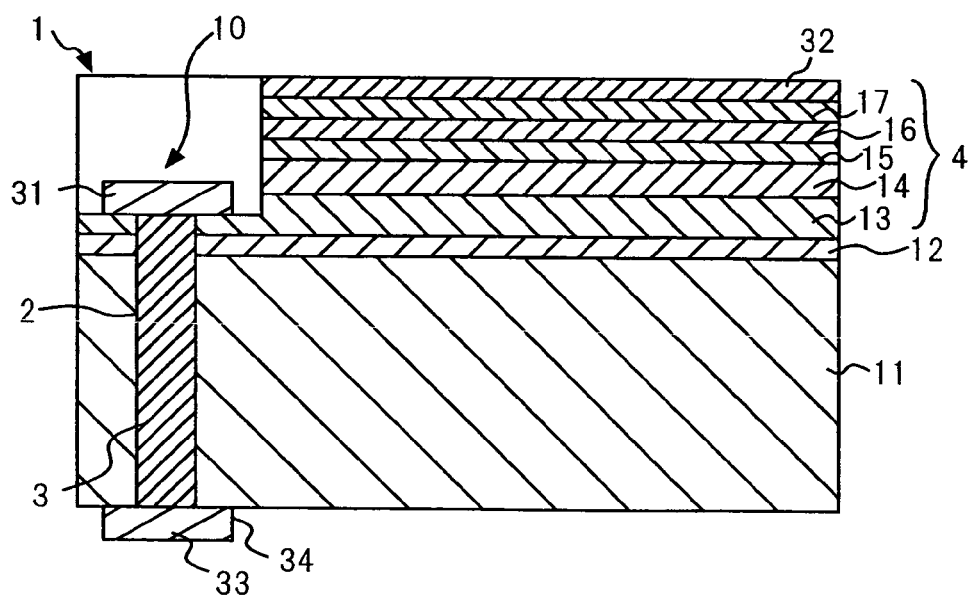
FIG. 2 is a cross sectional view of the compound semiconductor light emitting device 1 taken along the line II-II of FIG. 1.

A first embodiment will be described by referring to FIGS. 1 and 2. FIG. 1 is a bottom plan view of a compound semiconductor light emitting device 1 according to the first embodiment of the present invention as seen from the rear side. FIG. 2 is a cross sectional view of the compound semiconductor light emitting device 1 taken along the line II-II of FIG. 1.

The device 1 is characterized by comprising a hole 2 which perpendicularly passes therethrough, as illustrated in FIG. 2. This through hole 2 is formed in a cylindrical or coned shape of 30 μm-100 μm in diameter by laser beams during laser-processing. The through hole 2 may also be formed in an hourglass shape with diameters of openings in the front and rear surfaces are wider than that in the middle.

In this embodiment, the hole 2 of 50 μm in diameter is formed by laser-processing. It is preferable to irradiate the laser from the laminated semiconductor layer side. The hole 2 is used as a path conducting electricity in a perpendicular direction of the device (i.e. an electrical path). The electrical path is formed by filling inside the hole 2 with a conductive material 3. One example to provide this conductive material 3 is to press conductive paste into the hole 2 to fill it up.

The conductive material 3 may also be formed by plating. For example, after evaporating and depositing nickel (Ni) as seed on the front surface of the hole 2, copper (Cu) is plated on the wall inside the hole 2 to serve as the conductive material 3.

Additionally, molten solder or metallic micro-balls may also be used instead of conductive paste to fill up the hole 2.

The device 1 comprises a semiconductor layer 4 formed by laminating two or more semiconductor thin films on a substrate 11. The substrate 11 is an insulative substrate. For example, the substrate 11 is a sapphire substrate. In the device 1, first conductivity type semiconductor layers and second conductivity type semiconductor layers are successively formed and laminated on a buffer layer 12 to form the semiconductor layer 4. The buffer layer 12 is interposed between the substrate 11 and the semiconductor layer 4.

The buffer layer 12 and the semiconductor layer 4 are formed by MOCVD method for example. An example of the buffer layer 12 is an $Al_xGa_{1-x}N$ ($0 \leq X \leq 1$) layer of 300 nm in thickness formed on the substrate 11. An n-type contact layer 13 made of an n-type GaN layer of 3 μm in thickness doped with silicon (Si) for example is formed on this buffer layer 12. An n-type cladding layer 14 made of n-type $Al_xGa_{1-x}N$ ($0 \leq X \leq 1$) of approximately 300 nm in thickness doped with silicon (Si) for example is formed on the n-type contact layer 13. A multi-quantum well structure active layer 15 having a composition of $Al_aIn_bGa_{1-a-b}N$ ($0 \leq a$, $0 \leq b$, $a+b \leq 1$) is formed on the n-type cladding layer 14. A p-type cladding layer 16 made of p-type $Al_yGa_{1-y}N$ ($0 \leq Y \leq 1$) of 300 nm in thickness doped with magnesium (Mg) for example is formed on the active layer 15. A p-type contact layer 17 made of p-type GaN of 500 nm in thickness doped with magnesium (Mg) for example is formed on the p-type cladding layer 16.

The semiconductor layer 4 may also be formed directly on the substrate 11 without interposing the buffer layer 12.

A part of the n-type contact layer 13 (the first conductivity type semiconductor layer) is exposed by removing the semiconductor layers (including the second conductivity type semiconductor layers) laminated thereon and the exposed part of the contact layer 13 serves as an exposure region 10. The removal of the semiconductor layer 4 is performed by a process including dry etching. The above-mentioned through hole 2 is provided in the exposure region 10.

To reduce damage to the semiconductor layer 4, it is preferable to irradiate a laser from the same side where the semiconductor layer 4 is formed. Although the hole 2 is set to be a cylindrical shape with identical diameters from top to bottom, the completed hole 2 is slightly tapered. Alternately the through hole 2 may be formed by irradiating a laser from the substrate 11 side after irradiating the laser from the semiconductor layer 4 side. A laser which emits light at a wavelength to be absorbed in the substrate 11 is selected.

Since the substrate 11 is a sapphire substrate, a short-wavelength laser of 500 nm or shorter is used here. In this embodiment, an ultra violet laser of wavelength 355 nm which is the third harmonic of a YAG laser categorized as a solid-state laser is employed. The laser beam is irradiated from the semiconductor layer 4 side to a possible center of the hole 2, which will be the a center of an n-type electrode, for about one (1) second to form the hole 2 of 50 μm in diameter under the condition; repetition frequency (f) 3 kHz, scanning rate 0.5 mm/second, defocus(DF)-80 μm and power 1.85 W. The diameter of the hole 2 may range from 30 μm to 100 μm by controlling defocus(DF) and irradiating time.

A YAG laser's fundamental frequency of 1,060 nm, second harmonic of 533 nm or fourth harmonic of 266 nm may also be employed.

The hole 2 formed in this way is filled up with the conductive material 3. Prior to filling the hole 2 with the conductive material 3, parts of the semiconductor layer 4, which were damaged through the laser process, are removed by dry etching. Chloride or fluoride gas may be used as etching gas when removing the damaged parts of the semiconductor layer by dry etching.

The conductive material 3 may be filled as follows for example. First, the device is set upside down so that the semiconductor layer 4 is directed downward, and a mask made of an adhesive sheet is applied to the substrate 11. A portion is cut out from the mask in desired size so that the conductive material is filled through the cutout portion. A conductive material such as conductive paste is filled in centering around the cutout portion of the mask. Being compressed by a spatula and so on, the conductive material is press-fitted into the hole 2. The adhesive sheet which is the mask is peeled off after the conductive material 3 is press-fitted into the hole 2 and the hole 2 is filled up with the conductive material 3. The conductive material 3 is then hardened by thermal treatment in a curing oven at a temperature of 200° C. for thirty minutes. After that, excess conductive material is removed by stripping solution, thereby completing the filling process of the conductive material 3 into the hole 2.

If necessary, the rear surface of the substrate 11 undergoes a backlapping process so that the thickness of the substrate 11 is reduced from 350 μm-430 μm to about 95 μm.

An electrode 31 to make ohmic contact is formed on the exposure region 10 of the n-type contact layer 13. The n-type ohmic electrode 31 is disposed on the exposure region 10 so as to make contact with the upper end of the through hole 2. The n-type ohmic electrode 31 formed on the n-type contact layer 13 is electrically connected with the conductive material 3. If the conductive material 3 formed in the through hole 2 can make ohmic contact with the n-type contact layer 13, the conductive material 3 disposed in the through hole 2 may also serve as the electrode 31. In other words, the formation of the electrode 31 may be omitted by forming the conductive material 3 capable of making ohmic contact with the n-type contact layer 13. The conductive material 3 in the through hole 2 may serve as the electrode 31. A metallic material used to form the electrode 31 may also be used for the conductive material 3 in the through hole 2.

An electrode 32 is formed on the p-type contact layer 17 to make ohmic contact therewith. The electrode 32 is formed to cover the entire surface of the p-type contact layer 17. The electrode 32 is a reflective electrode to reflect light generated in the device 1.

The electrode 32 may be formed to cover only a part of the p-type contact layer 17 to reflect some of the light generated in the device 1. The rest of the light, which was not reflected from this part, may be reflected from a member which is formed on the opposite side of the p-type contact layer 17 to the electrode 32, and which reflects the wavelength of the light generated in the device 1. When light is taken out from the electrode 32 side, the electrode 32 may be replaced with a light transmitting electrode through which light generated in the device 1 can pass.

As illustrated in FIGS. 1 and 2, an electrode 33 is formed on the opposite surface (rear surface) of the substrate 11 to the surface where the semiconductor layer 4 is formed. The electrode 33 is electrically connected to the conductive material 3 disposed inside the through hole 2. The conductive material inside the through hole 2 may also serve as the electrode 33. The electrode 33 also serves as a pad electrode 34 with a predetermined thickness. Although in this embodiment, the pad electrode 34 is disposed to cover the through hole 2 as shown in FIG. 1, the pad electrode 34 may also be disposed apart from the through hole 2. The pad electrode 34 is used for wire bonding. When the pad electrode 34 and the exposure region 10 are viewed as if they are on a plane, the electrode 34 and the exposure region 10 look overlapping one another. However, the pad electrode can be disposed so as not to overlap with the exposure region 10, for example, to a position as will be seen in FIG. 19.

A plurality of devices 1 are formed on a substrate of about two inches in diameter as a wafer (not shown). After that, the wafer is divided into dices to form individual devices. For dividing the wafer, the laser beam used for the formation of the through hole 2 may also be employed to form grooves for division. Grooves for division may be formed on the opposite surface of the substrate 11 to the surface where the semiconductor layer 4 is formed, or on the surface of the substrate 11 where the semiconductor layer 4 is formed, or both the opposite surface of the substrate 11 to the surface where the semiconductor layer 4 is formed and the surface of the substrate 11 where the semiconductor layer 4 is formed.

When grooves for division are formed on the opposite surface of the substrate 11 to the surface where the semiconductor layer 4 is formed, the groove depth is set to extend from the rear surface of the substrate 11 to just before the active layer 15. In this embodiment, the groove depth is set to be somewhat shorter than the thickness of the substrate 11 so that a part of the substrate 11 remains. Even when grooves are formed on the surface of the substrate 11 where the semiconductor layer 4 is formed, the groove depth for division is preferably set to be 20-70% of the thickness of the substrate 11. Additionally, parts of the semiconductor layer 4, which were damaged through laser-processing, should preferably be removed by dry etching. Chloride or fluoride gas may be used as etching gas when removing the damaged parts of the semiconductor layer by dry etching.

Figure 3:
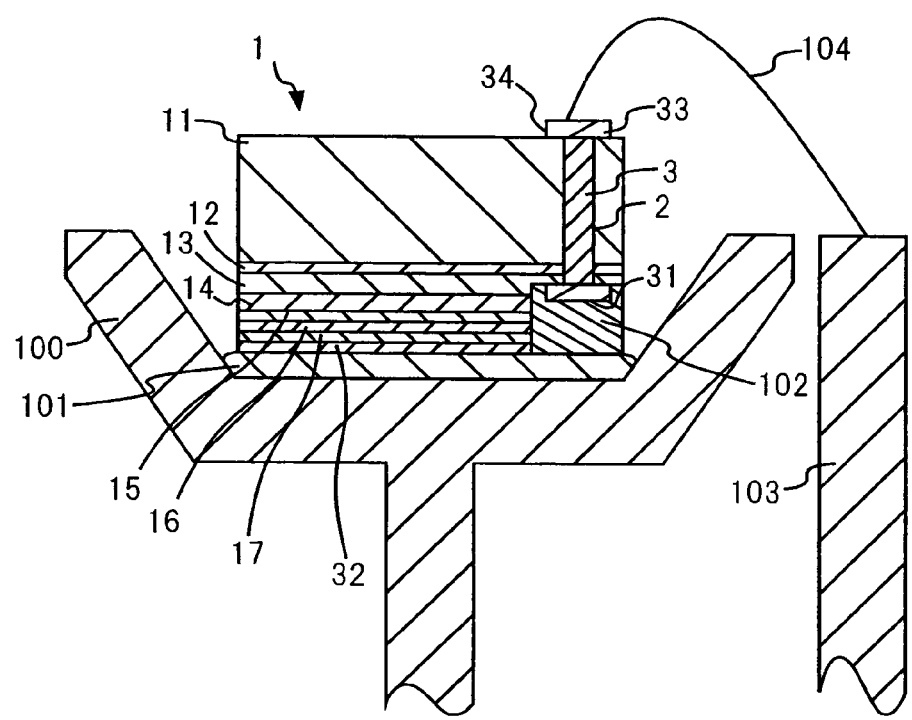
FIG. 3 is a cross sectional view of an indicator including the compound semiconductor light emitting device according to the first embodiment of the present invention.

FIG. 3 shows a light emitting apparatus comprising the light emitting device 1. The light emitting device 1 is inverted so that the substrate 11 lies on top and is disposed on a first lead electrode 100. The electrode 32 of the device 1 is electrically connected to the first lead electrode 100 via a conductive material 101. Attention is needed only to adhere the lead electrode 100 immediately onto the conductive material 101, and microscopic positioning is not needed. The electrode 31 and the n-type contact layer 13 should preferably be coated with an insulative material 102 to prevent the conductive material 101 from contacting them. The insulative material 102 for this coating should preferably be disposed in the device 1 in advance to cover the exposure region 10. The pad electrode 34 at the substrate 11 side and a second lead electrode 103 are electrically connected through a bonding wire such as a gold wire 104.

When certain voltage or an electric current is supplied to the first and second electrodes 100 and 103, an electrical path is formed through the first lead electrode 100, the conductive material 101, the electrode 32, the semiconductor layer 4, the electrode 31, the conductive material 3, the electrode 33 (34), the bonding wire 104 and the second lead electrode 103, so that light can be taken out from the active layer 15. If the light emitting device 1 is utilized for an LED indicator, the device 1, the electrode 100 and 103 should preferably be molded with resin to improve the light extraction efficiency.

Since each of the pair of electrodes is disposed respectively on one side and the other side of the substrate 11, the amount of light shaded by the electrodes can be reduced as compared with a conventional example where both electrodes are disposed on the same side of the substrate, resulting in improvement of the light extraction efficiency. Furthermore, working efficiency in assembling work may also be improved because wire bonding is needed only once. The device can be mounted easily to a proper position by only aligning the p-type electrodes 32 with the base.

Figure 4:
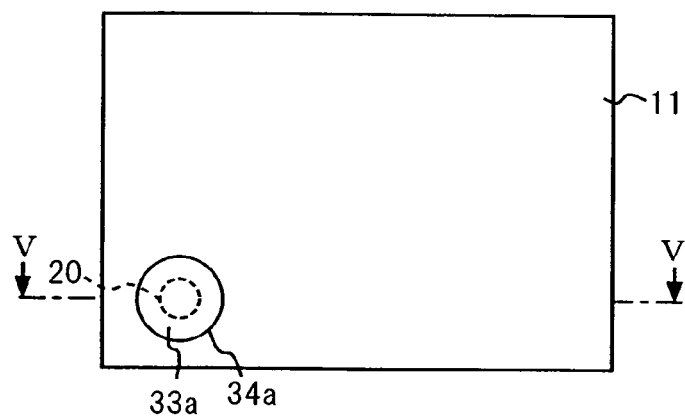
FIG. 4 is a bottom plan view from a rear side of the compound semiconductor light emitting device 1 according to a second embodiment of the present invention.
Figure 5:
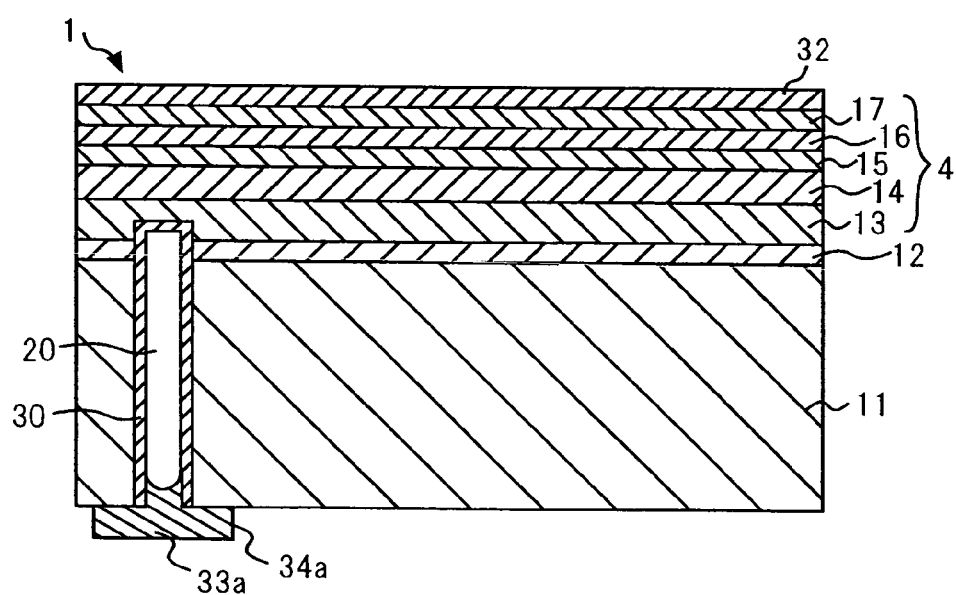
FIG. 5 is a cross sectional view of the compound semiconductor light emitting device 1 taken along the line V-V of FIG. 4.

Next, a second embodiment will be described by referring to FIGS. 4 and 5. FIG. 4 is a bottom plan view of the device 1, which corresponds to FIG. 1. FIG. 5 is a cross sectional view taken along the line V-V of FIG. 4, which corresponds to FIG. 2. Same reference notes are given to components common with the first embodiment shown in FIGS. 1 and 2, and description of them will be omitted to avoid duplication of explanation. Differences will be described mainly.

The device 1 is characterized by comprising a longitudinal hole 20 which perpendicularly extends to but does not pass through the n-type contact layer 13. This longitudinal hole 20 is formed in a cylindrical or coned shape of 30 μm-100 μm in diameter by laser beams during laser-processing. The longitudinal hole 20 may also be formed in an hourglass shape with diameters of its openings and its bottom wider than that in the middle.

In this embodiment, the longitudinal hole 20 of 50 μm in diameter is formed by laser-processing. The longitudinal hole 20 is used as a path conducting electricity in a perpendicular direction of the device (i.e. an electrical path). To form the electrical path, a conductive material 30 such as a metallic thin film is formed to cover the inner surface of the longitudinal hole 20. Although the conductive material 30 is preferably formed by plating, which makes formation of the material throughout a microscopic area easier, it may also be formed by deposition of metal in such cases where the diameter of the hole is large or a tapered surface is formed. The longitudinal hole 20 may be filled up inside with a conductive material such as metallic materials.

An example of forming the conductive material 30 by plating includes forming a deposited film of 20 nm in thickness on a wall inside the longitudinal hole 20 prior to plating copper (Cu) by deposition. The deposited film is made of titanium (Ti), platinum (Pt), gold (Au) or the like, each of which can make ohmic contact with the n-type contact layer 13. Thus the conductive material 30, or the plated layer is formed on the wall inside the longitudinal hole 20. The conductive material 30 may be formed either by exclusively using materials capable of making ohmic contact with the n-type contact layer 13, or by plating or providing the conductive paste or the like inside the longitudinal hole 20 in which a film, which is made of materials capable of making ohmic contact and which contacts with the n-type contact layer 13, was formed.

The metallic materials to be filled into the longitudinal hole 20 may include conductive paste, molten solder or metallic micro-balls.

In the first embodiment, a part of the n-type contact layer 13 is exposed to form an exposure region by removing a part of the semiconductor layer 4 laminated thereon. In this embodiment, however, the surface, which makes contact with the semiconductor layer, of the contact layer 13 is formed in a same planar shape as that of the semiconductor layer including the p-type contact layer 17 thereon, thus there is no such exposure region on the contact layer 13.

The longitudinal hole 20 is formed by laser irradiation in the drilling process. To reduce the damage to the semiconductor layer 4, it is preferable to irradiate the laser from the opposite surface (rear surface) of the substrate 11 to the surface (front surface) where the semiconductor layer 4 is formed. Although the longitudinal hole 20 is set to be a cylindrical shape with identical diameters from top to bottom, the completed hole 20 is slightly tapered. In this embodiment, for example, the rear surface of the substrate 11 may undergo a backlapping process so that the thickness of the substrate 11 is reduced from 350 μm-430 μm to about 45 μm before the laser irradiation. The longitudinal hole 20 is formed in a mortar-shape with diameters at the opening and the bottom part respectively 50 μm and 40 μm.

A laser which emits light at a wavelength to be absorbed in the substrate 11 is selected, as in the first embodiment. Since the substrate 11 is a sapphire substrate, a short-wavelength laser of 500 nm or shorter is used here. In the second embodiment, as in the first embodiment, an ultra violet laser of wavelength 355 nm which is the third harmonic of a YAG laser categorized as a solid-state laser is employed. Other lasers such as YAG laser's fundamental frequency of 1,060 nm, second harmonic of 533 nm or fourth harmonic of 266 nm may also be employed.

The intensity of the laser beam profile used herein shows a Gaussian distribution. The longitudinal hole 20 is formed to the extent that its end reaches the n-type contact layer 13 but not reaches the cladding layer 14.

As described above, the conductive material 30 connected to the n-type contact layer 13 comprises a metallic thin film suitable for making ohmic contact with the n-type contact layer 13. An electrode 32 is formed on the p-type contact layer 17 to make ohmic contact therewith. The electrode 32 is formed to cover the entire surface of the p-type contact layer 17. Alternately, the electrode 32 may be formed to cover only a part of the p-type contact layer 17. The electrode 32 is a reflective electrode to reflect light generated in the device 1.

In such devices where light is taken out from the electrode 32 side, the electrode 32 may be replaced with a light transmitting electrode though which light generated in the device 1 can pass. Apart from being translucent, the electrode 32 may be a comb electrode or a mesh electrode made of light-shielding materials, both structured to transmit light. In the second embodiment, a part of the semiconductor layer 4 above the n-type electrode is not removed, which may maintain the broad light emitting area when light is taken out from the electrode 12 side.

When light is not taken out from the electrode 32 side, light transmitted through the electrode 32 may be reflected by a member disposed on the opposite side of the electrode 32 to the p-type contact layer 17. The member reflects the wavelength of light emitted from the device.

Figure 19:
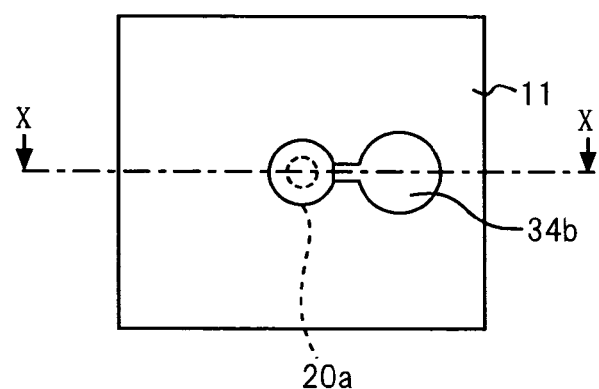
FIG. 19 is a bottom plan view from a rear side of the compound semiconductor light emitting device 1 according to an eighth embodiment of the present invention.

As shown in FIGS. 4 and 5, an electrode 33a is formed on the opposite surface of the substrate 11 to the surface where the semiconductor layer 4 is formed. The electrode 33a is electrically connected to the conductive material 30a disposed inside the longitudinal hole 20. The conductive material 30 disposed inside the longitudinal hole 20 may also serve as the electrode 33a. The electrode 33a also serves as a pad electrode 34a with a predetermined thickness. In the second embodiment, the pad electrode 34a is disposed to block the opening of the longitudinal hole 20 to minimize shading areas as shown in FIG. 4. The pad electrode 34a may also be disposed apart from the longitudinal hole 20 in the same way as shown in FIG. 19, which will be described later. The planar dimension of the pad electrode 34a is larger than that of the opening of the longitudinal hole 20. The pad electrode 34a is used for wire bonding.

Figure 6:
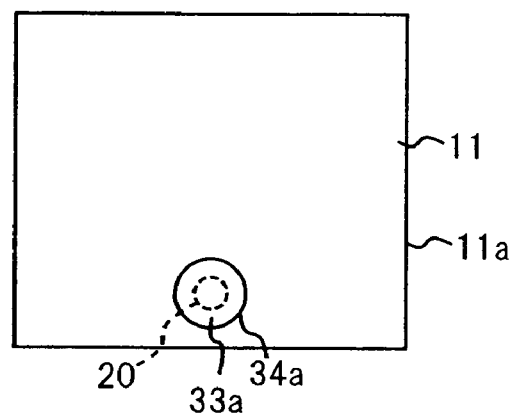
FIG. 6 is a bottom plan view of a device according to a modified example of the second embodiment of the present invention.
Figure 7:
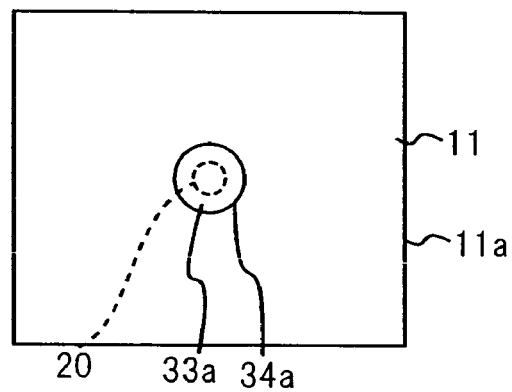
FIG. 7 is a bottom plan view of a device according to another modified example of the second embodiment of the present invention.

As shown in FIG. 4, the pad electrode 34a and the longitudinal hole 20 are disposed at one corner of the substrate 11 in the second embodiment. As shown in FIGS. 6 and 7, however, they may also be disposed near the center of one side or at the center of the substrate 11 when viewed as a plane. The longitudinal hole 20 is disposed inside a lateral surface 11a of the substrate 11 at a constant distance from the lateral surface 11a.

As described above, a plurality of devices 1 are formed on a substrate of about two inches in diameter as a wafer (not shown). After that, the wafer is divided into dices to make individual devices. For dividing the wafer, a laser beam used for the formation of the longitudinal hole 20 may also be employed to form grooves for division. Grooves for division may be formed on the opposite surface of the substrate 11 to the surface where the semiconductor layer 4 is formed, or on the surface of the substrate 11 where the semiconductor layer 4 is formed, or both the opposite surface of the substrate 11 to the surface where the semiconductor layer 4 is formed and the surface of the substrate 11 where the semiconductor layer 4 is formed. When grooves for division are formed on the opposite surface of the substrate 11 to the surface where the semiconductor layer 4 is formed, the groove depth is set to extend from the rear surface of the substrate 11 to just before the active layer 15. In this embodiment, the groove depth is set to be somewhat shorter than the thickness of the substrate 11 so that a part of the substrate 11 remains. Even when grooves are formed on the surface of the substrate 11 where the semiconductor layer 4 is formed, the groove depth for division is preferably set to be 20-70% of the thickness of the substrate 11. Parts of the semiconductor layer 4, which were damaged through laser-processing, are removed by dry etching.

In the same manner of forming the grooves for division, deep grooves for making contact with the n-type contact layer 13 could be formed on the rear surface of the substrate 11 in the form of a wafer in the longitudinal and lateral directions so as to form a grid pattern. When the wafer having such a structure is divided, the division of the devices may start from the deep grooves, leading a high possibility of deformation of the devices.

On the contrary, the longitudinal hole 20 formed in the above-mentioned embodiment is different in shape from the grooves for division. The division of the devices cannot start from the longitudinal hole 20, thus preventing the deformation upon dividing the devices.

Figure 8:
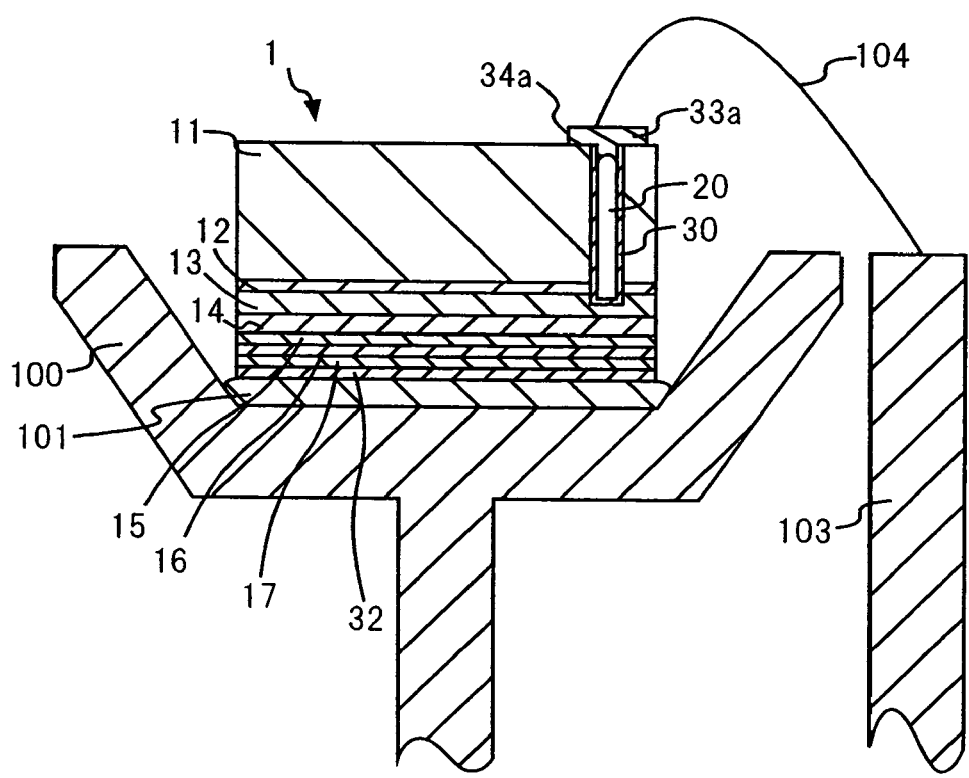
FIG. 8 is a cross sectional view of an indicator including the compound semiconductor light emitting device according to the second embodiment of the present invention.

FIG. 8 shows a light emitting apparatus comprising the light emitting device 1. The light emitting device 1 is inverted and disposed on a first lead electrode 100 so that the substrate 11 lies on top for making the substrate 11 a light extraction surface. The electrode 32 of the device 1 is electrically connected to the first lead electrode 100 via a conductive material 101. The pad electrode 34a at the substrate 11 side and a second lead electrode 103 are electrically connected through a bonding wire such as a gold wire 104.

When certain voltage or current is supplied to the second lead electrodes 100 and 103, an electrical path is formed through the first lead electrode 100, the conductive material 101, the electrode 32, the semiconductor layer 4, the conductive material 30a, the electrode 33a (34a), the bonding wire 104 and the second lead electrode 103 so that light can be taken out from the active layer 15. Therefore, there are few places in the electrical path wherein electric fields are concentrated, resulting in a high ESD robustness.

Light which is output from the active layer 15 is taken out of the device 1 through the substrate 11. If the light emitting device 1 is utilized for an LED indicator, the device 1, the electrodes 100 and 103 should preferably be molded with resin to improve the light extraction efficiency.

Since each one of the pair of electrodes is disposed respectively on one side and the other side of the substrate 11, light shaded by the electrodes can be reduced as compared with a conventional example where both electrodes are disposed on the same side of the substrate, which improves the light extraction efficiency. Furthermore, working efficiency in assembling work may also be improved because wire bonding is needed only once.

Figure 9:
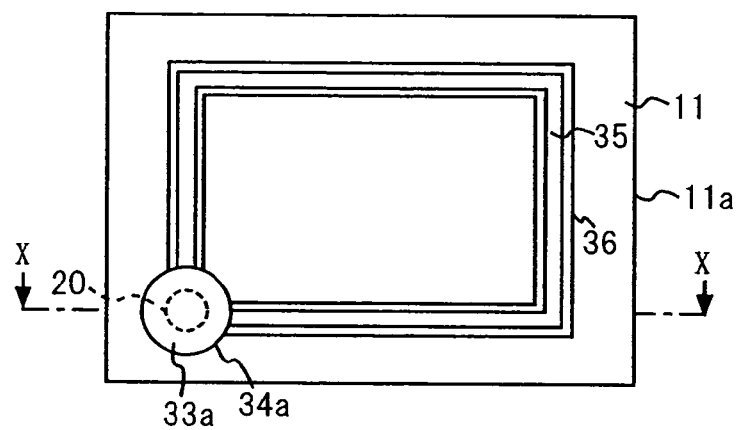
FIG. 9 is a bottom plan view from a rear side of the compound semiconductor light emitting device 1 according to a third embodiment of the present invention.
Figure 10:
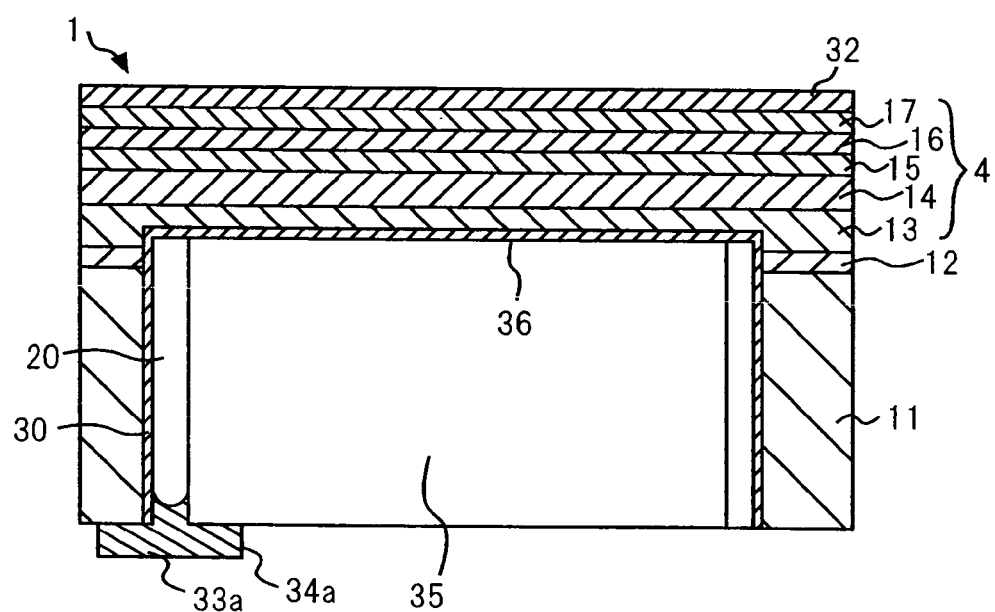
FIG. 10 is a cross sectional view of the compound semiconductor light emitting device 1 taken along the line X-X of FIG. 9.

Next, a third embodiment will be described by referring to FIGS. 9 and 10. FIG. 9 is a bottom plan view of the device 1, which corresponds to FIG. 4. FIG. 10 is a cross sectional view taken along the line X-X of FIG. 9, which corresponds to FIG. 5. Same reference notes are given to components which are common with the first embodiment shown in FIGS. 1 and 2, and description of them will be omitted to avoid duplication of explanation. Differences will be described mainly.

The third embodiment is characterized by adding a groove 35 and a conductive material 36 disposed therein to the second embodiment. In other words, the groove 35 which does not pass through the semiconductor device 1 is formed on the rear surface of the substrate 11. The end of the groove 35 contacts the n-type contact layer 13.

As the above-mentioned longitudinal hole 20, the groove 35 is formed by irradiating a laser. The groove 35 is joined to the longitudinal hole 20 and they are interconnected. The groove 35 is formed inside a lateral surface 11a of the substrate 11, at a constant distance from the lateral surface 11a so that the groove 35 does not protrude beyond the lateral surface 11a. The groove 35 takes the form of a hollow square when viewed as a plane. The sides of the groove 35 extend along the outer edges of the substrate without intersecting each other so that the substrate outside the groove 35 is continuously remained like a frame. Thus an adverse effect caused by the groove 35 in dividing the devices can be reduced.

A conductive material 36 is formed on surfaces of the groove 35. Although the conductive material 36 is formed from the same material as, and simultaneously with the conductive material 30 used to form the electrical path in the longitudinal hole 20, it may also be separately formed from a material of the same kind. The conductive material 36 makes ohmic contact with the n-type contact layer 13 to be electrically connected thereto. Therefore, the area in which the n-type contact layer 13 and the electrode 33a are electrically connected is larger than that of the second embodiment. If the conductive material 36 is formed by making a metal capable of making ohmic contact with the n-type contact layer 13 ultra-thin, the conductive material 36 may be a translucent material which light from the active layer 15 passes through. If the conductive material 30 is formed by making a metal capable of making ohmic contact with the n-type contact layer 13 ultra-thin, the conductive material 30 may be a translucent material which light from the active layer 15 passes through. The light extraction efficiency can be greatly improved, as compared to light shielding types of conductive materials, if the whole or a part of the conductive material 36 or the conductive material 30 is translucent. This light emitting device is also utilized in a light emitting apparatus like aforementioned embodiments.

Figure 11:
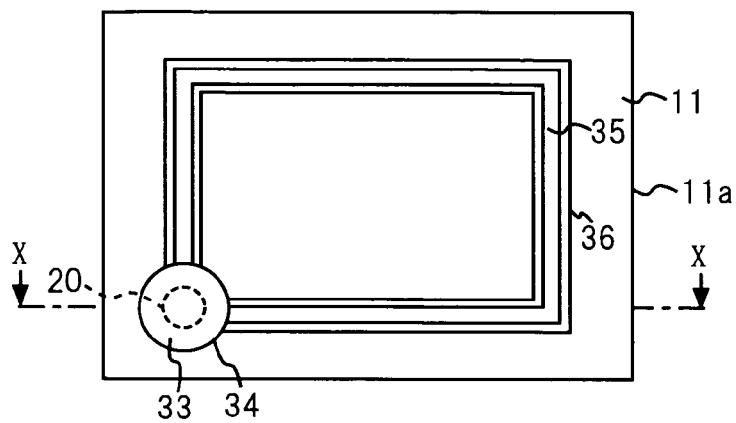
FIG. 11 is a bottom plan view from a rear side of the compound semiconductor light emitting device 1 according to a fourth embodiment of the present invention.
Figure 12:
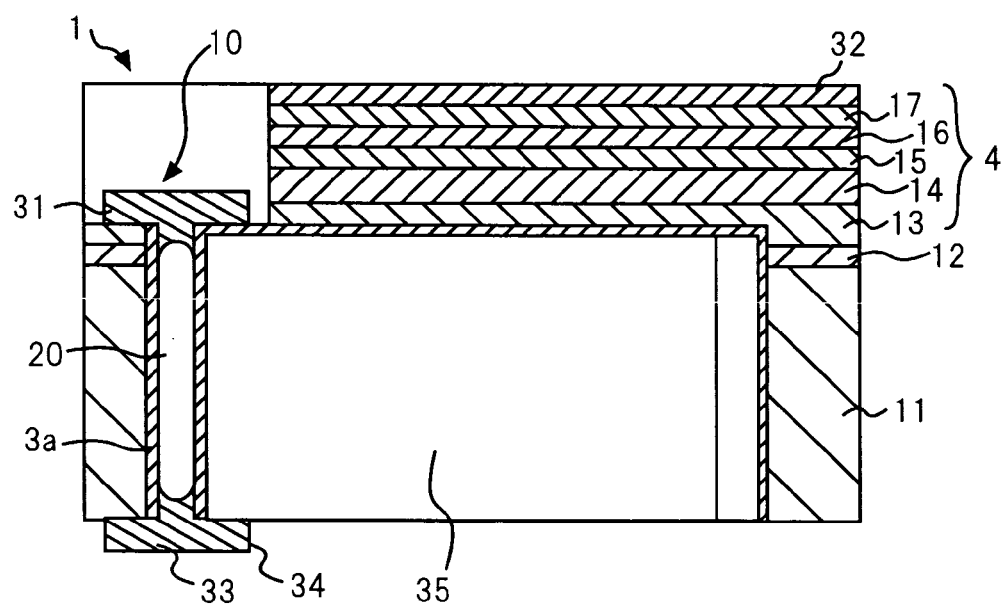
FIG. 12 is a cross sectional view of the compound semiconductor light emitting device 1 taken along the line X-X of FIG. 11.

Next, a fourth embodiment will be described by referring to FIGS. 11 and 12. FIG. 11 is a bottom plan view of the device 1, which corresponds to FIG. 1. FIG. 12 is a cross sectional view taken along the line X-X of FIG. 11, which corresponds to FIG. 2. Same reference notes are given to components which are common with the embodiment shown in FIGS. 1 and 2, and description of them will be omitted to avoid duplication of explanation. Differences will be described mainly.

The fourth embodiment is characterized by adding a groove 35 and a conductive material 36 disposed therein to the first embodiment. In other words, the groove 35 which does not pass through the semiconductor device 1 is formed on the rear surface of the substrate 11. The end of the groove 35 contacts the n-type contact layer 13.

As the above-mentioned through hole 2, the groove 35 is formed by irradiating a laser. The groove 35 is joined to the through hole 2 and they are interconnected. The groove 35 is formed inside a lateral surface 11a of the substrate 11 so that the groove 35 does not protrude beyond the lateral surface 11a of the substrate 11. A conductive material 3a is formed on the wall inside the through hole 2.

Similar to the third embodiment, the groove 35 takes the form of a hollow square when viewed as a plane. The electrode material 36 made of the same or the same kind of a material as the conductive material 3a for the electrical path formed on the wall inside the through hole 2 is formed inside the groove 35. The electrode material 36 makes ohmic contact with the n-type contact layer 13 to be electrically connected thereto. Therefore, the area in which the n-type contact layer 13 and the electrode 33 are electrically connected is larger than that of the first embodiment.

Figure 13:
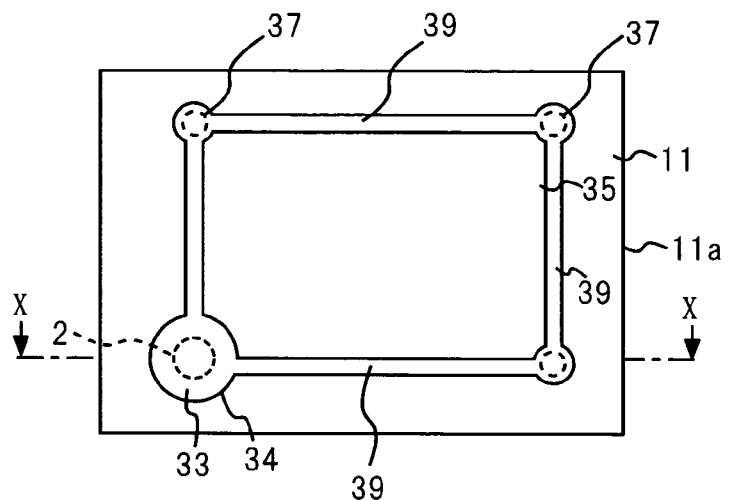
FIG. 13 is a bottom plan view from a rear side of the compound semiconductor light emitting device 1 according to a fifth embodiment of the present invention.
Figure 14:
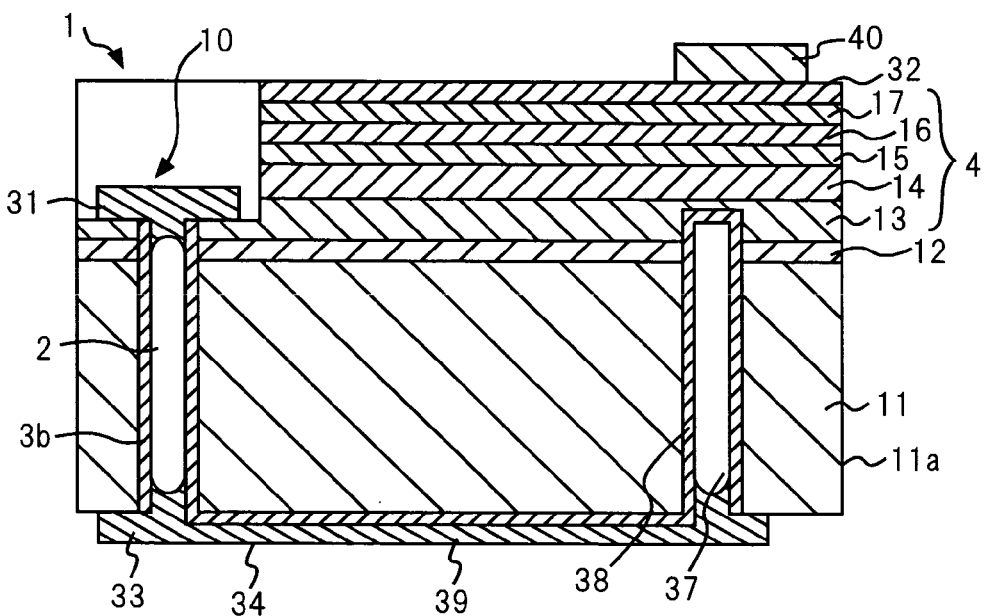
FIG. 14 is a cross sectional view of the compound semiconductor light emitting device 1 taken along the line X-X of FIG. 13.

Next, a fifth embodiment will be described by referring to FIGS. 13 and 14. FIG. 13 is a bottom plan view of the device 1, which corresponds to FIG. 1. FIG. 14 is a cross sectional view taken along the line X-X of FIG. 13, which corresponds to FIG. 2. Same reference notes are given to components which are common with the first embodiment shown in FIGS. 1 and 2, and description of them will be omitted to avoid duplication of explanation. Differences will be described mainly.

The fifth embodiment is characterized by adding longitudinal holes 37, electrode materials 38 disposed therein and an electrode 39 for connecting the electrode materials 38 at the rear surface of the substrate 11 to the first embodiment. In other words, a plurality of longitudinal holes 37 which do not pass through the semiconductor device 1 are formed on the rear surface of the substrate 11. The ends of the longitudinal holes 37 contact the n-type contact layer 13. As the above-mentioned through hole 2, the longitudinal holes 37 are formed by irradiating a laser. The longitudinal holes 37 are formed independently without being joined to the through hole 2. The longitudinal holes 37 are formed inside a lateral surface 11a of the substrate 11 so as not to protrude beyond the lateral surface 11a of the substrate 11. The longitudinal holes 37 are formed in the vicinity of three corners of the substrate 11, except a corner where the through hole 2 is disposed. A conductive material 3b is formed on the wall inside the through hole 2. The electrode materials 38 made of the same or the same kind of a material as the conductive material 3b formed inside the through hole 2 is formed on the wall inside the longitudinal holes 37. The conductive material 38 makes ohmic contact with the n-type contact layer 13 to be electrically connected thereto.

The electrode 39 which connects the conductive material 3b in the though hole 2 and the electrode materials 38 in the longitudinal holes 37 is formed simultaneously with forming the electrode 33. The conductive material 3b and the electrode materials 38 are interconnected on the rear side of the substrate 11 via the electrode 39. The electrode materials 38 in the longitudinal holes 37 are also interconnected by the material of the electrode 33 which forms the pad electrode 34. Therefore, the area in which the n-type contact layer 13 and the electrode 33 are electrically connected is larger than that of the first embodiment. Also, the area where the electrode inside the longitudinal holes 37 shades light can be smaller, as compared to the fourth embodiment.

In each of the above-described embodiments, a pad electrode 40 of a certain thickness may be additionally formed on the electrode 32 as shown in FIG. 14, if the electrode 32 is a thin, light-transmitting type electrode, or an electrode is needed for the purpose of wire bonding.

Figure 15:
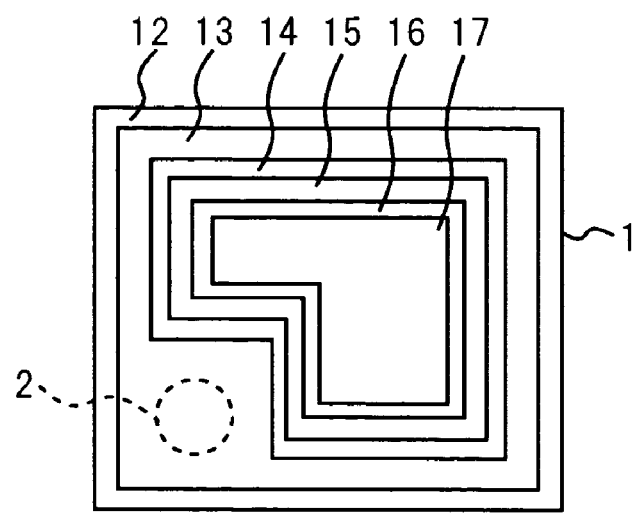
FIG. 15 is a plan view of a device according to a modified example of the sixth embodiment of the present invention.
Figure 16:
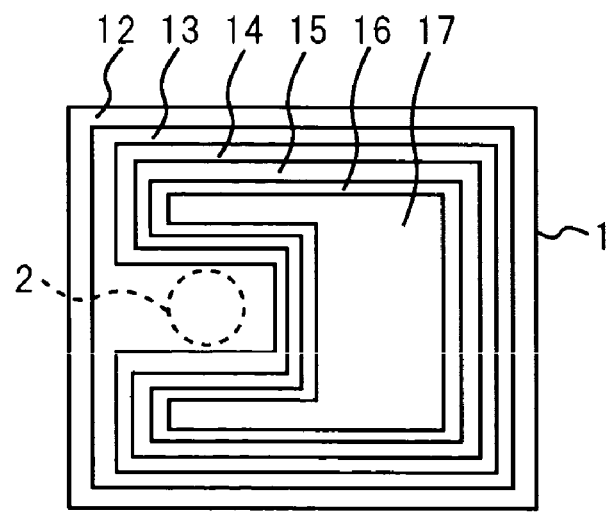
FIG. 16 is a plan view of a device according to another modified example of the sixth embodiment of the present invention.

A sixth embodiment illustrated in FIGS. 15 and 16 shows a formation of a mesa by means of etching circumferences of the p-type contact layer 17, p-type cladding layer 16, active layer 15 and n-type cladding layer 14 to expose the n-type contact layer 13 and a fabrication of an electrode on the exposed n-type contact layer to electrically connect the n-type contact layer 13 and the through hole 2. These enable the electric current to be widely distributed through the semiconductor while preventing a current concentration on some p-n junction interfaces, thus enhancing ESD robustness.

Figure 17:
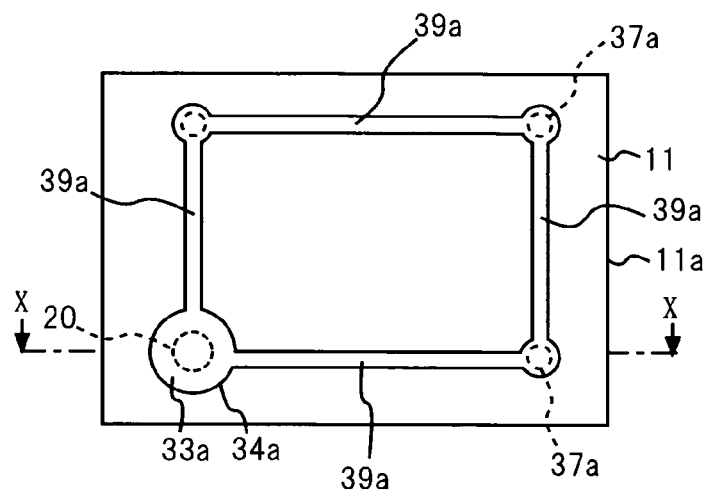
FIG. 17 is a bottom plan view from a rear side of the compound semiconductor light emitting device 1 according to a seventh embodiment of the present invention.
Figure 18:
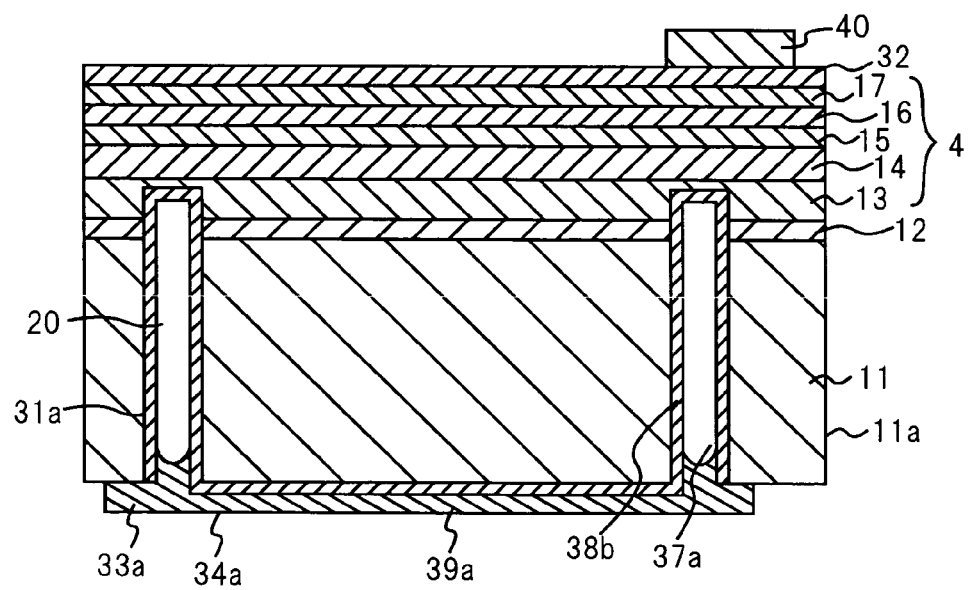
FIG. 18 is a cross sectional view of the compound semiconductor light emitting device 1 taken along the line X-X of FIG. 17.

Next, a seventh embodiment will be described by referring to FIGS. 17 and 18. FIG. 17 is a bottom plan view of the device 1, which corresponds to FIG. 4. FIG. 18 is a cross sectional view taken along the line X-X of FIG. 17, which corresponds to FIG. 5. Same reference notes are given to components which are common with the above-described embodiments, and description of them will be omitted to avoid duplication of explanation. Differences will be described mainly.

The seventh embodiment is characterized by adding longitudinal holes 37a, conductive materials 38a disposed therein and an electrode 39a for connecting the conductive materials 38a at the rear surface of the substrate 11 to the second embodiment. A plurality of longitudinal holes 37a which do not pass through the semiconductor device 1 are formed on the rear surface of the substrate 11. The ends of the longitudinal holes 37a contact the n-type contact layer 13. As the above-mentioned longitudinal hole 20, the longitudinal holes 37a are formed by irradiating a laser. The longitudinal holes 37a are formed independently without being joined to the longitudinal hole 20. The longitudinal holes 37a are formed inside a lateral surface 11a of the substrate 11 so as not to protrude beyond the lateral surface 11a of the substrate 11. The longitudinal holes 37a are formed in the vicinity of three corners of the substrate 11, except a corner where the longitudinal hole 20 is disposed. The conductive materials 38b made of the same or the same kind of a material as the conductive material 31a formed inside the longitudinal hole 20 is formed on the wall inside the longitudinal holes 37a. The conductive materials 38b make ohmic contact with the n-type contact layer to be electrically connected thereto.

The electrodes 33a and 39a which connect the conductive material 31a in the longitudinal hole 20 and the conductive materials 38b in the longitudinal holes 37a are formed by simultaneously forming both materials 33a and 39a. The conductive material 31a and the conductive materials 38b are interconnected at the rear side of the substrate 11 via the electrode 39a. The electrode material 31a in the longitudinal hole 20 and the conductive materials 38b in the longitudinal holes 37a are interconnected also by a material of the electrode 33a which forms the pad electrode 34. If the electrode 39a is translucent, the electrode 33a on the electrode 39a should preferably be removed except for the pad electrode 34 to prevent the electrode 33a from shading light. Therefore, the area in which the n-type contact layer 13 and the electrode 33a are electrically connected is larger than that of the second embodiment. Also, the area where the material inside the longitudinal hole 20 shades light can be smaller, as compared with the third embodiment. Like aforementioned embodiments, this light emitting device is utilized in a light emitting apparatus with an arrangement where the substrate 11 lies on top as shown in FIG. 8.

In each of the above-described embodiments, a pad electrode 40 of a certain thickness may be formed additionally on the electrode 32 as shown in FIG. 18, if the electrode 32 is a light-transmitting electrode or an electrode is needed for the purpose of wire bonding. By doing so, the device of FIG. 18 can be incorporated as it is into the light-emitting apparatus of FIG. 8, in other words, the surface of the substrate 11 on which the semiconductor layer 4 is formed can be used as a light extracting surface. In this case, the electrode 33 on the substrate 11 side is connected with the first lead electrode 100, while the electrode 40 on the opposite side is connected with the second lead electrode 103 with wire bonding.

Figure 20:
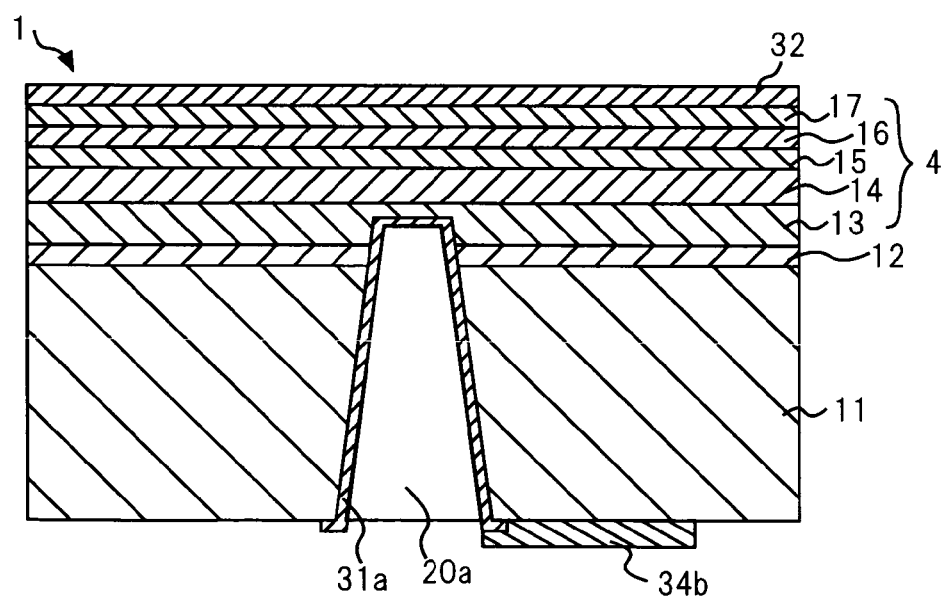
FIG. 20 is a cross sectional view of the compound semiconductor light emitting device 1 taken along the line X-X of FIG. 19.

Next, an eighth embodiment will be described by referring to FIGS. 19 and. 20. FIG. 19 is a bottom plan view of the device 1, which corresponds to FIG. 4. FIG. 20 is a cross sectional view taken along the line X-X of FIG. 19, which corresponds to FIG. 1. Same reference notes are given to components which are common with the above-described embodiments and description of them will be omitted to avoid duplication of explanation. Differences will be described mainly.

The eighth embodiment is characterized by that the cross sectional shape of the longitudinal hole 20 of the second embodiment is tapered toward the depth direction and that the pad electrode 34b connected to the conductive material 31a is disposed separately from the longitudinal hole 20a. In other words, the shape of the longitudinal hole 20a is changed from a cylindrical shape to a truncated cone shape. Such a longitudinal hole 20a may be formed by laser-processing, for example, using a laser having intensity distribution in which intensity peaks of the laser with a Gaussian beam profile are truncated (beam profile of a shaped beam).

Since the longitudinal hole 20a is shaped as described above, the conductive material 30a can be easily formed to a predetermined thickness on a wall inside the hole 20a from the rear side of the substrate 11 by deposition, sputtering and so on. Also, the slanted surface of the longitudinal hole 20a can be utilized as a light reflecting surface. Like aforementioned embodiments, this light emitting device is also utilized in a light emitting apparatus with an arrangement where the substrate 11 lies on top as shown in FIG. 21.

Figure 22:
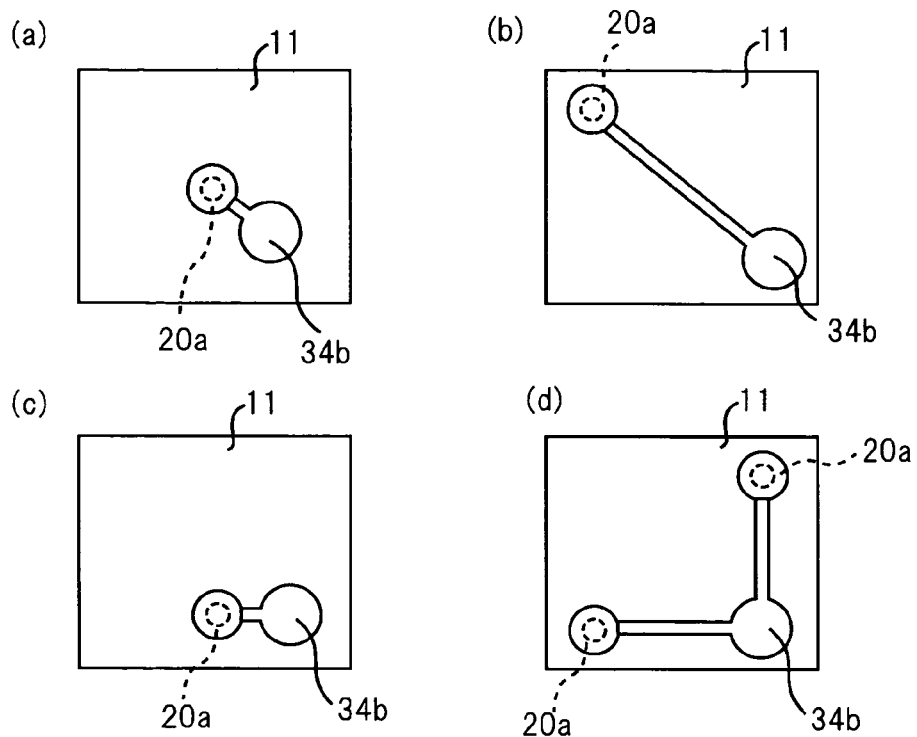
FIG. 22 is a bottom plan view of a device according to a modified example of the eighth embodiment of the present invention.
Figure 23:
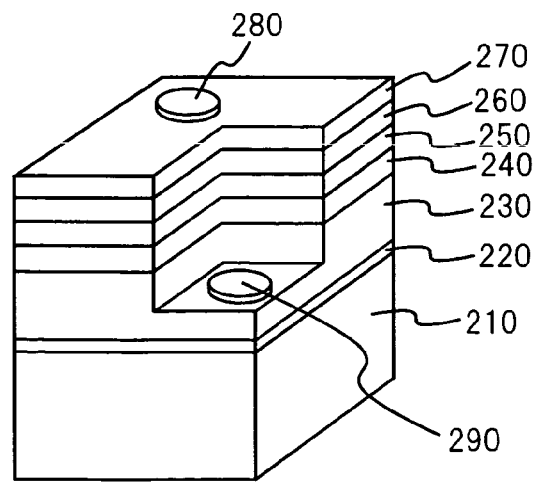
FIG. 23 is a perspective view of a conventional device.

Although the longitudinal hole 20a is disposed at the center of the substrate and the pad electrode 34b is disposed adjacently to the center of a side next to electrode 34b, the disposition may be changed as shown in FIG. 22. FIG. 22(*a*) shows an example where the longitudinal hole 20a is disposed at the center of the substrate while the pad electrode 34a is disposed at a corner of the substrate 11. FIG. 22(*b*) shows an example where the longitudinal hole 20a is disposed at one corner on one diagonal line of the substrate 11 while the pad electrode 34b is disposed at the other corner on the diagonal line of the substrate 11. FIG. 22(*c*) shows an example where the longitudinal hole 20a is disposed adjacently to the center part of a side of the substrate 11 while the pad electrode 34b is disposed at a corner of the substrate 11. FIG. 22(*d*) shows an example where the longitudinal holes 20a are disposed at both corners on one diagonal line of the substrate 11 while the pad electrode 34b is disposed at a corner on the other diagonal line of the substrate 34a.

Figure 21:
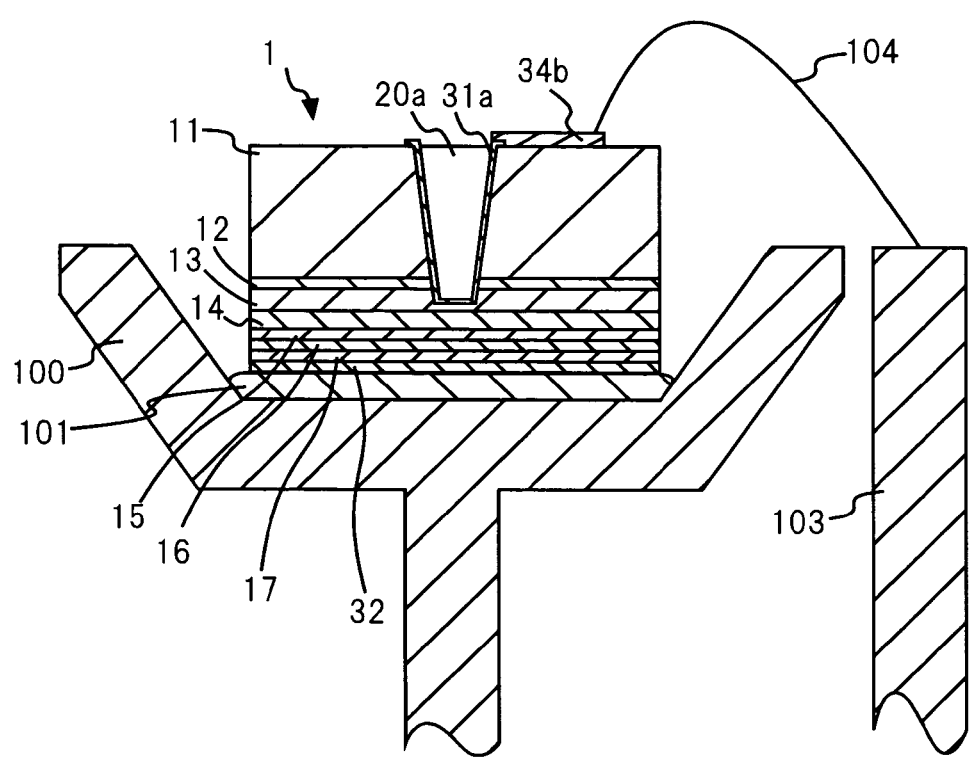
FIG. 21 is a cross sectional view of an indicator including the compound semiconductor light emitting device according to the eighth embodiment of the present invention.

Like aforementioned embodiments, this light emitting device is also utilized in a light emitting apparatus with an arrangement where the substrate 11 lies on top as shown in FIG. 21.

The present invention is not limited to the embodiments described above, but can be modified in various ways without departing from subject matters of the invention. For example, the invention may be applicable to a device utilizing a semiconductor substrate other than an insulative substrate as the substrate 11.

As described above, the present invention realizes a high-efficiency light extraction. Also the present invention can enhance ESD robustness of a device.

The device can be mounted easily to a proper position by only aligning the second conductivity type semiconductor layer with the base.

INDUSTRIAL APPLICABILITY

As described above, the compound semiconductor light emitting device of the present invention is suitable for a blue light emitting diode, a blue laser diode and the like.

We claim:

1. A compound semiconductor light emitting device comprising:
    an insulative substrate;
    a semiconductor layer including a plurality of semiconductor thin film layers laminated on one surface of the insulative substrate to form an active layer, a first semiconductor thin film layer being closest to the insulative substrate;
    a first electrode provided on a top surface of the semiconductor layer
    a second electrode provided on a rear surface of the insulative substrate;
    an exposure region formed by removing semiconductor on the first semiconductor thin film layer so that the first semiconductor thin film layer to be connected to the second electrode is exposed;
    a through hole penetrating the insulative substrate and the first semiconductor thin film layer in the exposure region;
    an electrical path formed in the through hole to electrically connect the first semiconductor thin film layer and the second electrode; and
    an ohmic electrode which is electrically connected to the electrical path formed in the through hole and which makes ohmic contact to the first semiconductor thin film layer located in the exposure region.

2. The compound semiconductor light emitting device according to claim 1, wherein
    the electrical path is comprised of either a conductive material formed on a wall inside the through hole or a conductive material filled in the through hole.

3. The compound semiconductor light emitting device according to claim 1, wherein
    the insulative substrate is a sapphire substrate, and
    the semiconductor thin film layer is a gallium nitride compound semiconductor layer.

4. The compound semiconductor light emitting device according to claim 1, wherein
    a diameter of the through hole ranges from 30 μm to 100 μm.

5. The compound semiconductor light emitting device according to any one of claims 1, 3 or 4, wherein
    a groove or a longitudinal hole in addition to the through hole is formed in the insulative substrate so that the second electrode provided on the rear surface of the insulative substrate and the first semiconductor thin film layer are electrically connected through an electrical path in addition to the electrical path.

6. The compound semiconductor light emitting device according to claim 1, wherein
    an insulative material is provided to cover the exposure region including the ohmic electrode.

7. The compound semiconductor light emitting device according to claim 1, wherein the other electrode for the electrical path provided on the other surface of the insulative substrate comprises a pad electrode for wire bonding.

8. The compound semiconductor light emitting device according to claim 3 comprising
    a base which comprises a first lead electrode, and
    a second lead electrode; wherein
    the one electrode is connected to the first lead electrode on the base;
    the other electrode is connected to the second lead electrode through a bonding wire; and
    light is extracted mainly from the insulative substrate side.

9. A manufacturing method of a compound semiconductor light emitting device comprising:
    laminating a semiconductor layer including a plurality of semiconductor thin film layers on one surface of an insulative substrate to form an active layer; and
    providing one electrode on top surface of the semiconductor layer, and the method further comprising:
    forming an exposure region by removing semiconductor on a first semiconductor thin film layer so that the first semiconductor thin film layer to be contacted with the other electrode is exposed;
    forming a through hole penetrating the insulative substrate and the first semiconductor thin film layer by laser processing in the exposure region;
    forming an electrical path in the through hole;
    forming an ohmic electrode which is electrically connected to the electrical path and which makes ohmic contact to the first semiconductor thin film layer located in the exposure region; and
    electrically connecting an electrode provided on the other surface of the insulative substrate and the first semiconductor thin film layer through the electrical path formed in the through hole and the ohmic contact.

10. The manufacturing method of the compound semiconductor light emitting device according to claim 9, wherein
    the through hole penetrating the device is formed in the exposure region by irradiating a laser from the laminated semiconductor layer.

11. The method of the compound semiconductor light emitting device according to claim 9, wherein
    an inside of the through hole is cleaned by dry etching after the through hole is formed.

12. The method of the compound semiconductor light emitting device according to claim 9, wherein
    an inside of the through hole is cleaned by dry etching using chloride or fluoride gas after the through hole is formed.

13. The manufacturing method of a compound semiconductor light emitting device according to claim 9, wherein
    a wafer including a plurality of the light emitting devices is divided into individual light emitting devices along grooves formed by laser-processing.

14. The method of the compound semiconductor light emitting device according to claim 13, wherein
    semiconductor layers damaged by laser-processing are removed by dry etching using chloride or fluoride gas after the grooves are formed.

15. The method of the compound semiconductor light emitting device according to claim 13, wherein
laser-processing for forming the grooves is performed from the insulative substrate side, or
from the laminated semiconductor layer side, or
from both the insulative substrate side and the laminated semiconductor layer side.

16. The manufacturing method of a compound semiconductor light emitting device according to claim 9, wherein
the ohmic electrode is connected to the first lead electrode on the base;
the other electrode is connected to the second lead electrode through a bonding wire; and
light is extracted mainly from the insulative substrate side.

17. A compound semiconductor light emitting device comprising:
an insulative substrate which is a sapphire substrate;
a first conductivity type semiconductor thin film layer formed on one surface of the insulative substrate;
an active layer formed on the first conductivity type semiconductor thin film layer;
a second conductivity type semiconductor thin film layer formed on the active layer;
one electrode provided on the second conductivity type semiconductor thin film layer;
the other electrode provided on the other surface of the insulative substrate;
a longitudinal hole formed by laser-processing so as to penetrate the insulative substrate and have a depth reaching the first conductivity type semiconductor thin film layer to be connected to the other electrode;
an electrical path made of a conductive material formed in the longitudinal hole to electrically connect the first semiconductor thin film layer and the other electrode;
a base which comprises a first lead electrode;
a second lead electrode; wherein
the one electrode is connected to the first lead electrode on the base;
the other electrode is connected to the second lead electrode through a bonding wire; and
light is extracted mainly from the insulative substrate side.

18. The compound semiconductor light emitting device according to claim 17, wherein
the conductive material is wholly or partially translucent.

19. The compound semiconductor light emitting device according to claim 17, wherein
the longitudinal hole is covered with a pad electrode with a larger diameter than a diameter of the longitudinal hole.

20. The compound semiconductor light emitting device according to any one of claims 17 to 19, wherein
the longitudinal hole is formed inside a lateral surface of the substrate at a constant distance from the lateral surface.

21. The compound semiconductor light emitting device according to claim 17, wherein
a pad electrode is disposed apart from the longitudinal hole on the other surface of the insulative substrate; and
the pad electrode and the conductive material are electrically connected.

22. The compound semiconductor light emitting device according to any one of claims 17 to 19, wherein
a diameter of the longitudinal hole ranges from 30 µm to 100 µm.

23. The compound semiconductor light emitting device according to any one of claims 17 to 19, wherein
a cross sectional shape of the longitudinal hole is tapered toward a depth direction.

24. The compound semiconductor light emitting device according to any one of claims 17 to 19, wherein
the semiconductor thin film layer is a gallium nitride compound semiconductor layer.

25. The compound semiconductor light emitting device according to claim 17, wherein
a plurality of the longitudinal holes are formed; and
conductive materials disposed in the plurality of the longitudinal holes are interconnected on the other surface of the insulative substrate.

26. The compound semiconductor light emitting device according to claim 17, wherein
the longitudinal hole is formed by irradiating a laser from the insulative substrate side.

27. The compound semiconductor light emitting device according to claim 17, wherein
an inside of the longitudinal hole is cleaned by dry etching using chloride or fluoride gas after the longitudinal hole is formed.

28. A manufacturing method of a compound semiconductor light emitting device comprising:
laminating a first conductivity type semiconductor thin film layer, an active layer, and a second conductivity type semiconductor thin film layer on one surface of an insulative substrate; and
providing one electrode and the other electrode respectively on top surface of the second conductivity type semiconductor thin film layer and on the other surface of the insulative substrate, and the method further comprising:
forming a longitudinal hole by irradiating a short-wavelength laser of 500 nm or shorter so as to have a depth reaching from the other surface of the insulative substrate to the first conductivity type semiconductor thin film layer to be connected to the other electrode;
electrically connecting the electrode provided on the other surface of the insulative substrate and the first semiconductor thin film layer through a conductive material formed in the longitudinal hole;
connecting the one electrode and a first lead electrode on a base; and
connecting the other electrode and a second lead electrode through a bonding wire.

29. The manufacturing method of a compound semiconductor light emitting device according to claim 28, wherein
a wafer including a plurality of the light emitting devices is divided into individual light emitting devices along grooves formed by laser-processing.

30. The manufacturing method of a compound semiconductor light emitting device according to claim 29, wherein
semiconductor layers damaged by laser-processing are removed by dry etching using chloride or fluoride gas after the grooves are formed.

31. The manufacturing method of a compound semiconductor light emitting device according to claim 30, wherein
laser-processing for forming the grooves are performed from the insulative substrate side, or
from the laminated semiconductor layer side, or
from both the insulative substrate side and the laminated semiconductor layer side.

* * * * *